(12) United States Patent
Li et al.

(10) Patent No.: US 11,973,856 B2
(45) Date of Patent: Apr. 30, 2024

(54) DRIVE AND DATA TRANSMISSION METHOD

(71) Applicant: HUAWEI TECHNOLOGIES CO., LTD., Guangdong (CN)

(72) Inventors: Yongyao Li, Shenzhen (CN); Fei Luo, Chengdu (CN); Jiankang Li, Chengdu (CN); Jiang Zhu, Chengdu (CN); Jieping Zeng, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 143 days.

(21) Appl. No.: 17/321,707

(22) Filed: May 17, 2021

(65) Prior Publication Data

US 2021/0297228 A1    Sep. 23, 2021

Related U.S. Application Data

(63) Continuation of application No. PCT/CN2020/073470, filed on Jan. 21, 2020.

(30) Foreign Application Priority Data

Jan. 22, 2019    (CN) .......................... 201910060479.0

(51) Int. Cl.
*H04L 7/00*    (2006.01)
*G06F 13/42*    (2006.01)

(52) U.S. Cl.
CPC .......... *H04L 7/005* (2013.01); *G06F 13/4265* (2013.01); *G06F 2213/0026* (2013.01); *G06F 2213/0042* (2013.01)

(58) Field of Classification Search
CPC ........................... H04L 7/005; G06F 13/4265
See application file for complete search history.

(56) References Cited

U.S. PATENT DOCUMENTS 5,502,750 A * 3/1996 Co ........................ H04J 3/0626
                                                                        375/372
5,796,796 A * 8/1998 Wang ...................... H04L 25/05
                                                                        375/372

(Continued)

FOREIGN PATENT DOCUMENTS

CN    101267292 A    9/2008
CN    104050128 A    9/2014

(Continued)

OTHER PUBLICATIONS

Extended European Search Report issued in European Application No. 20744674.1 dated Jan. 21, 2022, 7 pages.

(Continued)

*Primary Examiner* — Phong H Dang
(74) *Attorney, Agent, or Firm* — Fish & Richardson P.C.

(57) ABSTRACT

This application provides a drive and a data transmission method, to implement low-latency transmission. The drive includes a CDR circuit, an elastic buffer, a receiver circuit, and a transmitter circuit. The CDR circuit is configured to recover a receive clock from a received signal. The receiver circuit is configured to recover sent data from the received signal by using the receive clock. The elastic buffer is configured to move the sent data in by using the receive clock and move the data out by using the receive clock. The transmitter circuit is configured to send the sent data from the elastic buffer by using the receive clock.

21 Claims, 10 Drawing Sheets

(56) References Cited

U.S. PATENT DOCUMENTS

| | | | | |
|---|---|---|---|---|
| 7,791,370 | B1* | 9/2010 | Hoang | G06F 1/10 |
| | | | | 326/38 |
| 8,516,290 | B1* | 8/2013 | Thomas | G06F 13/405 |
| | | | | 713/400 |
| 2008/0159460 | A1* | 7/2008 | Kanai | H04L 25/03885 |
| | | | | 375/373 |
| 2009/0086874 | A1* | 4/2009 | Wang | H04L 7/005 |
| | | | | 375/372 |
| 2010/0054385 | A1* | 3/2010 | Chien | H04J 3/0632 |
| | | | | 375/372 |
| 2011/0188621 | A1* | 8/2011 | Asaduzzaman | H04L 7/0337 |
| | | | | 375/374 |
| 2016/0013927 | A1* | 1/2016 | Lee | H04L 7/033 |
| | | | | 375/371 |
| 2017/0019247 | A1* | 1/2017 | Iyer | H04L 1/243 |
| 2017/0351635 | A1 | 12/2017 | Chen et al. | |
| 2017/0366468 | A1 | 12/2017 | Shoor et al. | |
| 2018/0006799 | A1* | 1/2018 | Yadav | H03L 7/0807 |
| 2018/0253398 | A1* | 9/2018 | Wu | G06F 9/28 |
| 2019/0089359 | A1* | 3/2019 | Mehta | H03M 9/00 |

FOREIGN PATENT DOCUMENTS

| | | |
|---|---|---|
| CN | 106527576 A | 3/2017 |
| CN | 108121619 A | 6/2018 |
| CN | 109154927 A | 1/2019 |
| CN | 109857692 A | 6/2019 |
| WO | 2011100164 A2 | 8/2011 |
| WO | 2017189796 A1 | 11/2017 |

OTHER PUBLICATIONS

Office Action issued in Chinese Application No. 201910060479.0 dated Oct. 10, 2022, 8 pages.

PCT International Search Report and Written Opinion issued in International Application No. PCT/CN2020/073470 dated Apr. 17, 2020, 13 pages (partial English translation).

* cited by examiner

DRIVE AND DATA TRANSMISSION METHOD

CROSS-REFERENCE TO RELATED APPLICATIONS

This application is a continuation of International Application No. PCT/CN2020/073470 filed on Jan. 21, 2020, which claims priority to Chinese Patent Application No. 201910060479.0, filed on Jan. 22, 2019. The disclosures of the aforementioned applications are hereby incorporated by reference in their entireties.

TECHNICAL FIELD

This application relates to the communications field and, more specifically, to a drive and a data transmission method.

BACKGROUND

A peripheral component interconnect express (PCIe) bus is a high speed bus for connecting a processor to a peripheral device in a computer system. Because separate reference clocks with independent spread spectrum (SRIS) of the PCIe bus do not need a large quantity of echo clock signals, design complexity can be reduced, costs can be reduced, and impact of electromagnetic radiation can be reduced. Therefore, a PCIe SRIS scenario is applied more widely. In addition, as a PCIe signal rate is increased and the PCIe bus is applied more widely, a driver (Retimer) having a timing recovery function is more frequently used between two PCIe devices. However, when a retimer is applied in an SRIS scenario, a latency is caused because an SKP sequence needs to be added or deleted to compensate for a frequency difference between a transmit end and a receive end.

In the SRIS scenario, a latency is increased each time when one retimer is added, leading to a system performance loss. The impact is unacceptable in some application scenarios such as PCIe memory application scenarios. Therefore, how to reduce a latency when a retimer is applied in the SRIS scenario is a problem needing to be resolved.

SUMMARY

This application provides a drive and a data transmission method, to resolve a problem of an extra latency caused because an SKP sequence is added to or deleted from an elastic buffer, and implement low-latency transmission.

According to a first aspect, a drive is provided, including: a clock and data recovery (CDR) circuit, an elastic buffer, a receiver circuit, and a transmitter circuit. The CDR circuit is configured to recover a receive clock from a received signal. The receiver circuit is configured to recover sent data from the received signal by using the receive clock. The elastic buffer is configured to: move the sent data in by using the receive clock, and move the sent data out by using the receive clock. The transmitter circuit is configured to send, by using the receive clock, the sent data moved out from the elastic buffer.

A person skilled in the art may understand that, that the elastic buffer is configured to: move the sent data in by using the receive clock, and move the sent data out by using the receive clock specifically means that a clock used by the elastic buffer to move the sent data in and a clock used by the elastic buffer 430 to move the sent data out, namely, a read clock and a write clock of the elastic buffer, are obtained based on the receive clock. Specifically, the read clock and the write clock of the elastic buffer are equal to the receive clock divided by a quantity of bits included in one symbol output by the receiver circuit 420. For example, when one symbol output by the receiver circuit 420 includes eight bits, a frequency of the read clock and a frequency of the write clock of the elastic buffer 430 are equal to a value obtained by dividing a frequency of the receive clock by 8.

Optionally, the receiver circuit may include a receive equalization circuit, a sampling circuit, a serial-to-parallel conversion circuit, and a descrambling/decoding circuit.

The receive equalization circuit may include a continuous time linear equalization (CTLE)/decision feedback equalizer (DFE) circuit. The serial-to-parallel conversion circuit may perform serial-to-parallel conversion on serial data output by the sampling circuit, to obtain parallel data. The parallel data may be input to the descrambling/decoding circuit, and the descrambling/decoding circuit descrambles/decodes the data, and outputs descrambled/decoded parallel data. The descrambled/decoded parallel data may be input to the elastic buffer. The serial-to-parallel conversion circuit may be any circuit capable of converting serial data into parallel data, for example, a deserializer. However, this is not limited in this embodiment of this application.

Optionally, the transmitter circuit may include a scrambling/coding circuit, a parallel-to-serial conversion circuit, and a transmit equalization circuit. The scrambling/coding circuit may scramble/code an output of the elastic buffer, to output data conforming to a protocol or a coding structure. The parallel-to-serial conversion circuit may convert parallel data output by the scrambling/coding circuit into serial data by using the receive clock. The parallel-to-serial conversion circuit may be, for example, a serializer. However, this is not limited in this embodiment of this application. The transmit equalization circuit may include a feed forward equalizer (FFE) circuit.

The receiver circuit and the transmitter circuit of the drive provided in this application use a same clock domain, namely, the receive clock recovered by the CDR circuit so that a frequency difference between clocks of a receive end and a transmit end can be completely canceled, and a link training and status state machine (LTSSM) does not need to add or delete an SKP sequence to or from the elastic buffer, thereby canceling an extra latency caused by a frequency difference between receiving and transmission in an SRIS scenario and implementing low-latency transmission.

With reference to the first aspect, in a first possible implementation, the drive further includes a first clock conversion circuit and a second clock conversion circuit. The first clock conversion circuit is configured to generate a first clock based on the receive clock, where a frequency of the first clock is the same as an expected frequency of a local clock. The second clock conversion circuit is configured to: generate a transmit clock based on the first clock, and output the transmit clock to the transmitter circuit, where a frequency of the transmit clock is the same as the frequency of the receive clock.

Further, the expected frequency of the local clock may be 100 MHz, in other words, the frequency of the first clock is 100 MHz. However, this is not limited in this embodiment of this application.

It should be understood that the second clock conversion circuit may be implemented by using a phase-locked loop (PLL) circuit. For a specific function and an implementation of the PLL circuit, refer to the prior art.

For example, a first PLL circuit may be implemented by using a charge pump phase-locked loop (CPPLL) frequency synthesizer. The CPPLL frequency synthesizer may include a phase frequency detector (PFD), a charge pump (CP), a loop filter (LPF), a voltage-controlled oscillator (VCO), and a frequency divider (FD).

The PFD compares frequencies and phases of an input clock $F_{in}$ and a feedback clock to generate a switch control signal of charging and discharging currents of the lower-level CP. Under the action of the control signal, the CP charges or discharges the LPF so that a tuned voltage of the VCO changes correspondingly, to change a resonance frequency of the VCO. The VCO oscillates and outputs a signal $F_{VCO}$, and the DIV divides the signal, and then the signal participates in frequency discrimination and phase discrimination. Therefore, a closed-loop feedback system is formed, to implement a phase-locked frequency multiplication function.

A frequency of $F_{VCO}$ is N times a frequency of $F_{in}$. $F_{in}$ is the receive clock in this application. $F_{VCO}$ is the first clock in this application. N is a frequency multiplication coefficient, and may be preset during system design.

With reference to the first aspect or the first possible implementation of the first aspect, in a second possible implementation, the second clock conversion circuit is further configured to: generate a second clock based on the local clock, and output the second clock to the transmitter circuit, and the transmitter circuit is further configured to send data by using the second clock.

Specifically, in some cases, a clock input to the second clock conversion circuit may be the local clock, the second clock conversion circuit may generate the second clock based on the local clock, and the transmitter circuit may send data based on the second clock. In some other cases, a clock input to the second clock conversion circuit is the first clock generated by the first clock conversion circuit, the second clock conversion circuit may generate the transmit clock based on the first clock, and the transmitter circuit may send data based on the transmit clock. For example, in a low-latency mode, the input clock of the second clock conversion circuit is the first clock, and in a non-low-latency mode, the input clock of the second clock conversion circuit is the local clock.

Therefore, the drive provided in this embodiment of this application can resolve a problem of an extra latency caused because an SKP sequence is added to or deleted from an elastic buffer, and implement low-latency transmission. In addition, the drive has a function of selecting an internal clock and an external clock, that is, can select one of the receive clock and the local clock as the input clock of the second clock conversion circuit. This can adapt to a plurality of scenario requirements.

With reference to the first aspect, in a third possible implementation, the drive further includes a signal processing unit, and the signal processing unit is configured to perform jitter filtering on the receive clock to generate a transmit clock and output the transmit clock to the transmitter circuit, where a frequency of the transmit clock is the same as the frequency of the receive clock.

It should be understood that a specific form of the signal processing unit may be a PLL circuit in the prior art. However, this is not limited in this embodiment of this application.

Jitter filtering is performed on the receive clock so that clock signal quality can be improved, helping to improve performance of the drive.

With reference to any one of the first aspect or the first to the fourth possible implementations of the first aspect, in a fifth possible implementation, the drive supports a plurality of protocols and can select one of the plurality of protocols for working, and the plurality of protocols include at least one of the following: a peripheral component interconnect express PCIe protocol, a cache coherent interconnect for accelerators (CCIX) protocol, or a universal serial bus (USB) protocol.

The drive in this application can support a plurality of high speed buses, and is applied widely. In addition, during system design, there is no need to consider use of a plurality of drives. Therefore, hardware design complexity and a subsequent verification work amount can be reduced.

Optionally, a pin specified by the drive may be pulled up or pulled down, to select a protocol to be used by the drive. Alternatively, the drive is configured by system software after power-on and by using a management interface (for example, an Smbus) defined in a standard to work under a particular protocol. Alternatively, a protocol to be used by the drive is configured by using a particular negotiation bitstream.

According to a second aspect, a data transmission method is provided. The method is applied to a drive, the drive includes: a clock and data recovery CDR circuit, an elastic buffer, a receiver circuit, and a transmitter circuit, and the method includes: recovering, by the CDR circuit, a receive clock from a received signal; recovering, by the receiver circuit, sent data from the received signal by using the receive clock; moving, by the elastic buffer, the sent data in by using the receive clock, and moving the sent data out by using the receive clock; and sending, by the transmitter circuit by using the receive clock, the sent data moved out from the elastic buffer.

In the data transmission method provided in this application, the receiver circuit and the transmitter circuit use a same clock domain, namely, the receive clock recovered by the CDR circuit so that a frequency difference between clocks of a receive end and a transmit end can be completely canceled, and a link state machine (link training and status state machine, LTSSM) does not need to add or delete an SKP sequence to or from the elastic buffer, thereby canceling an extra latency caused by a frequency difference between receiving and transmission in an SRIS scenario, and implementing low-latency transmission.

With reference to the second aspect, in a first possible implementation, the drive further includes a first clock conversion circuit and a second clock conversion circuit, and the method further including generating, by the first clock conversion circuit, a first clock based on the receive clock, where a frequency of the first clock is the same as an expected frequency of a local clock, and generating, by the second clock conversion circuit, a transmit clock based on the first clock, and outputs the transmit clock to the transmitter circuit, where a frequency of the transmit clock is the same as the frequency of the receive clock.

With reference to the second aspect or the first possible implementation of the second aspect, in a second possible implementation, in a low-latency mode, the first clock is input to the second clock conversion circuit, and in a non-low-latency mode, the local clock is input to the second clock conversion circuit.

Further, the frequency of the first clock is 100 MHz.

With reference to the second aspect, in a third possible implementation, the drive further includes a signal processing unit, and the method further comprising performing, by the signal processing unit, jitter filtering on the receive clock to generate a transmit clock, and outputting, by the signal processing unit, the transmit clock to the transmitter circuit, where a frequency of the transmit clock is the same as the frequency of the receive clock.

With reference to any one of the second aspect or the first to the third possible implementations of the second aspect, in a fourth possible implementation, the drive supports a plurality of protocols and can select one of the plurality of protocols for working, and the plurality of protocols include at least one of the following: a peripheral component interconnect express PCIe protocol, a cache coherent interconnect for accelerators CCIX protocol, or a universal serial bus USB protocol.

It should be understood that the drive in the second aspect may be the drive in any one of the first aspect or the possible implementations of the first aspect. For the method in the second aspect, refer to the descriptions of the drive in the first aspect.

According to a third aspect, a computer program product is provided. The computer program product includes a computer program (or referred to as code or an instruction), where when the computer program is run, a computer is enabled to perform the method provided in any one of the second aspect or the possible implementations of the second aspect.

According to a fourth aspect, a computer-readable medium is provided. The computer-readable medium stores a computer program (or referred to as code or an instruction), and when the computer program is run on a computer, the computer is enabled to perform the method in any one of the second aspect or the possible implementations of the second aspect.

According to a fifth aspect, a computer system is provided, including a processor, a memory, and one or more drives described above.

DESCRIPTION OF EMBODIMENTS

The following describes technical solutions of this application with reference to accompanying drawings.

Figure 1:
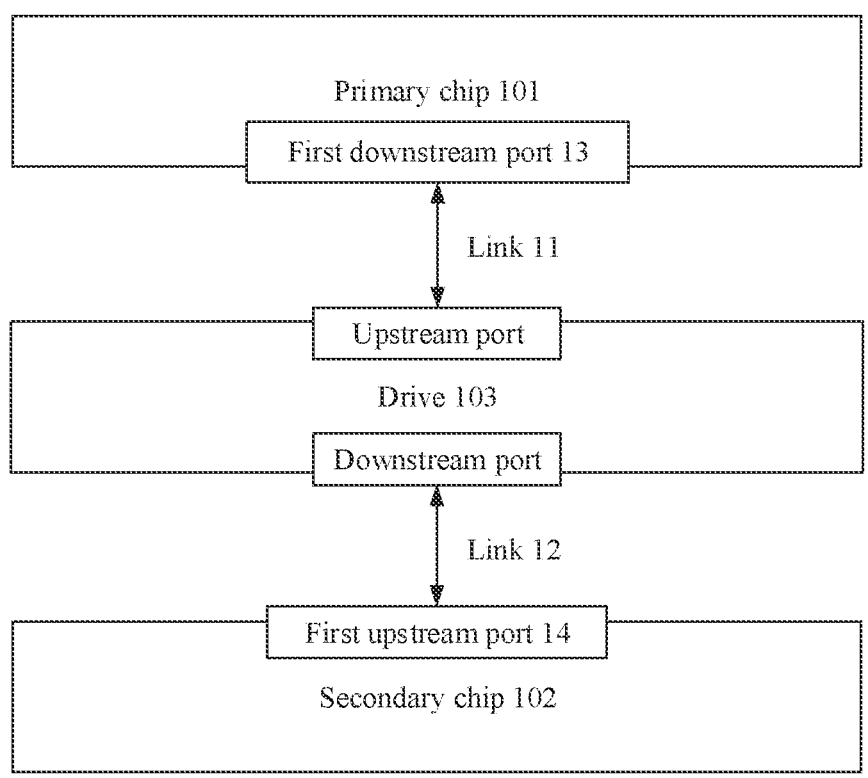
FIG. 1 is a schematic structural diagram of an application topology of a drive according to this application.

FIG. 1 is an example block diagram of an application topology of a drive having a timing recovery function (briefly referred to as a drive below). Referring to FIG. 1, a downstream port (DSP) of a primary chip 101 may be connected to an upstream port (USP) of a secondary chip 102 by using a drive 103. Specifically, a first downstream port 13 of the primary chip 101 is connected to an upstream port of the drive 103 by using a link 11, and a downstream port of the drive 103 is connected to a first upstream port 14 of the secondary chip 102 by using a link 12.

In addition, in this application, the first downstream port 13 of the primary chip 101 may be alternatively connected to the first upstream port 14 of the secondary chip 102 by using a plurality of cascaded drives. For example, FIG. 2 shows a case of two cascaded drives.

Figure 2:
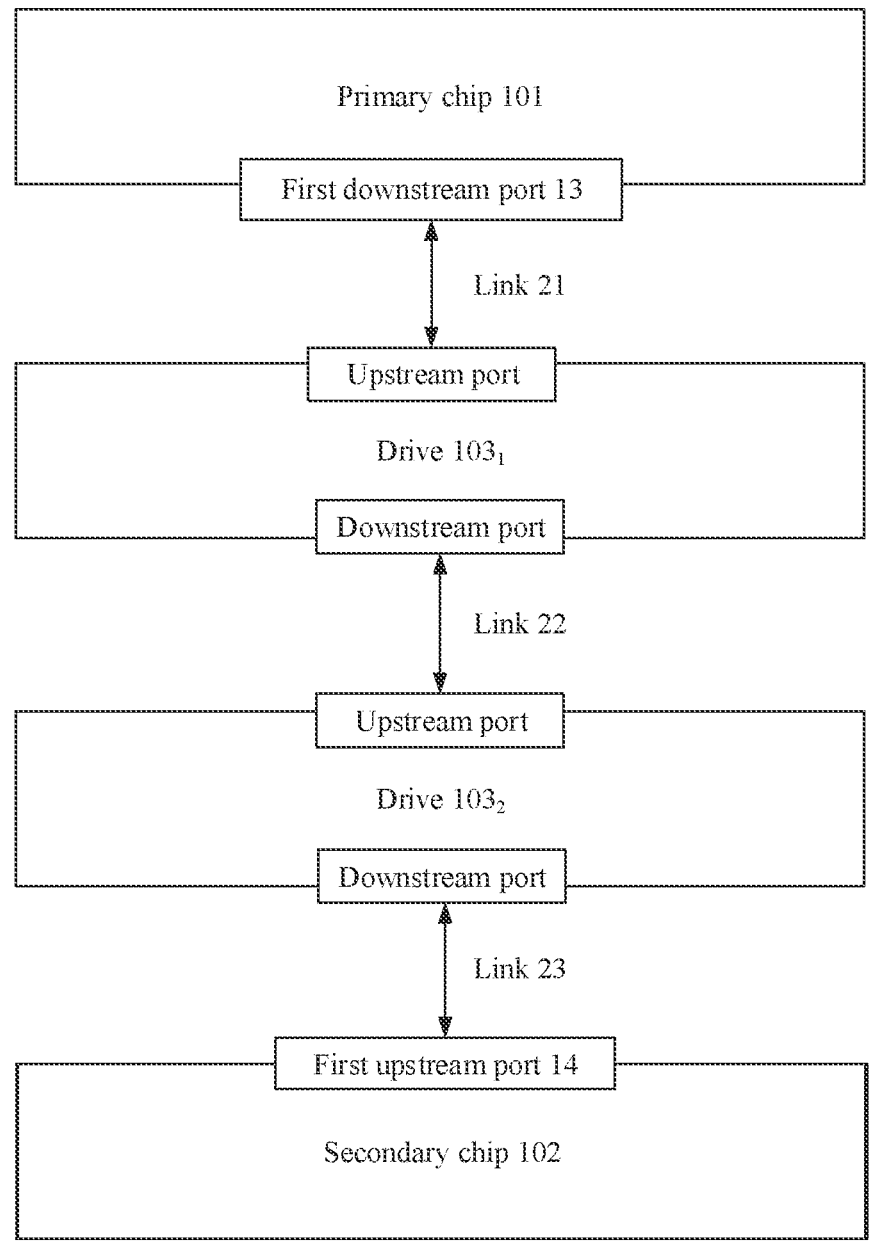
FIG. 2 is a schematic structural diagram of another application topology of a drive according to this application.

Referring to FIG. 2, the first downstream port 13 of the primary chip 101 is connected to an upstream port of a drive $103_1$ by using a link 21, a downstream port of the drive $103_1$ is connected to an upstream port of a drive $103_2$ by using a link 22, and a downstream port of the drive $103_2$ is connected to the first upstream port 14 of the secondary chip 102 by using a link 23.

In a topology structure shown in FIG. 1, for the drive 103, the primary chip 101 is an upstream chip (or referred to as an upstream device), and the secondary chip 102 is a downstream chip (or referred to as a downstream device). In a topology structure shown in FIG. 2, for the drive $103_1$, the primary chip 101 is an upstream chip, and the drive $103_2$ is a downstream chip. For the drive $103_2$, the drive $103_1$ is an upstream chip, and the secondary chip 102 is a downstream chip. It should be understood that if two ends of the link 23 are respectively connected to the downstream port of the drive $103_2$ and another drive, for example, a drive $103_3$, for the drive $103_2$, both the upstream chip and the downstream chip of the drive $103_2$ are drives.

The primary chip 101 may be a chip that includes a downstream port but is not a drive. For example, the primary chip 101 may be a root complex (RC) or a switch chip (Switch). The secondary chip 102 may be a chip that includes an upstream port but is not a drive. For example, the secondary chip 102 may be an endpoint device (Endpoint) or a switch chip. The endpoint device may be a graphics card, a network adapter, an optical channel card, a storage card, a switch chip, or the like. Each link shown in FIG. 1 and FIG. 2, for example, the link 11 or the link 21, may include one lane, two lanes, four lanes, eight lanes, 16 lanes, or another quantity of lanes, and each lane may include one pair of received signals (Rx) and one pair of sent signals (Tx). The drives (for example, the drive 103, the drive $103_1$, and the drive $103_2$) conform to a link protocol, to implement communication between the primary chip 101 and the secondary chip 102. The link protocol may be, for example, another protocol such as PCIe, CCIX, or USB.

Figure 3:
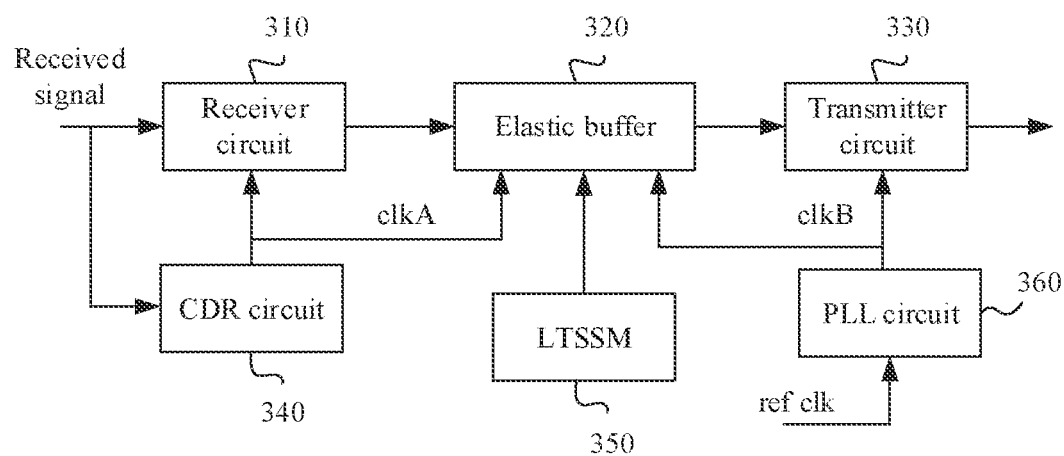
FIG. 3 is a schematic structural diagram of a drive in an existing standard.

FIG. 3 is a schematic structural diagram of a drive in an existing standard. Referring to FIG. 3, the drive mainly includes a receiver (Rx) circuit 310, an elastic buffer 320, a transmitter (Tx) circuit 330, a clock and data recovery (CDR) circuit 340, a link state machine (LTSSM) 350, and a phase-locked loop (PLL) circuit 360. The elastic buffer 320 may be a first in first out (FIFO) queue and is configured to buffer data.

When a standard retimer is applied in an SRIS scenario, the drive includes two clock domains, namely, a clock clkA recovered by the CDR circuit 340 from a received signal (or referred to as received data), and a local clock ref clk. The receiver circuit 410 and a write clock of the elastic buffer 320 use the cikA, and the transmitter circuit 330 and a read clock of the elastic buffer 320 use the ref clk.

Specifically, the clock clkA is provided for the receiver circuit 310 and is used by the receiver circuit 310 to sample the received signal to obtain serial data and convert the serial data into parallel data. The write clock of the elastic buffer 320 may be obtained based on the clkA, and the parallel data input by the receiver circuit 310 may be written into the elastic buffer 320 through the write clock. The PLL circuit

360 performs frequency multiplication on the input ref clk to obtain a clock clkB. The read clock of the elastic buffer 320 may be obtained based on the clkB, and data may be read from the elastic buffer 320 through the read clock. In addition, the clkB is provided for the transmitter circuit 330, and is used by the transmitter circuit to convert the parallel data into serial data and send the serial data. A person skilled in the art may understand that a frequency of the read clock of the elastic buffer 320 is equal to a frequency of the clkA divided by a quantity of bits included in one symbol output by the receiver circuit 310. A frequency of the write clock of the elastic buffer 320 is equal to a frequency of the clkB divided by the quantity of bits included in the symbol.

According to a definition in a standard, when the clkA and the clkB are applied in the SRIS, a maximum frequency difference is 5600 parts per million (PPM). Because there is a maximum deviation of 5600 PPM between a clock used by the elastic buffer 330 to move data in and a clock used by the elastic buffer 330 to move data out, the link state machine 370 needs to irregularly add or delete an SKP sequence to or from the elastic buffer 330, to compensate for the deviation and prevent overflow of the elastic buffer 330. However, in this process, an extra latency needs to be added. According to the definition in the standard, the extra latency added in this process is approximately 30 ns.

In view of this, this application provides a drive to cancel a frequency difference between a receive end and a transmit end in an SRIS application scenario and an extra latency caused by the frequency difference.

It should be noted that modules having a same reference numeral in the following specification indicate a same meaning, and may be implemented by using a same manner or similar manners. Therefore, a module is described only when the module appears for the first time, and details are not described thereafter again.

Figure 4:
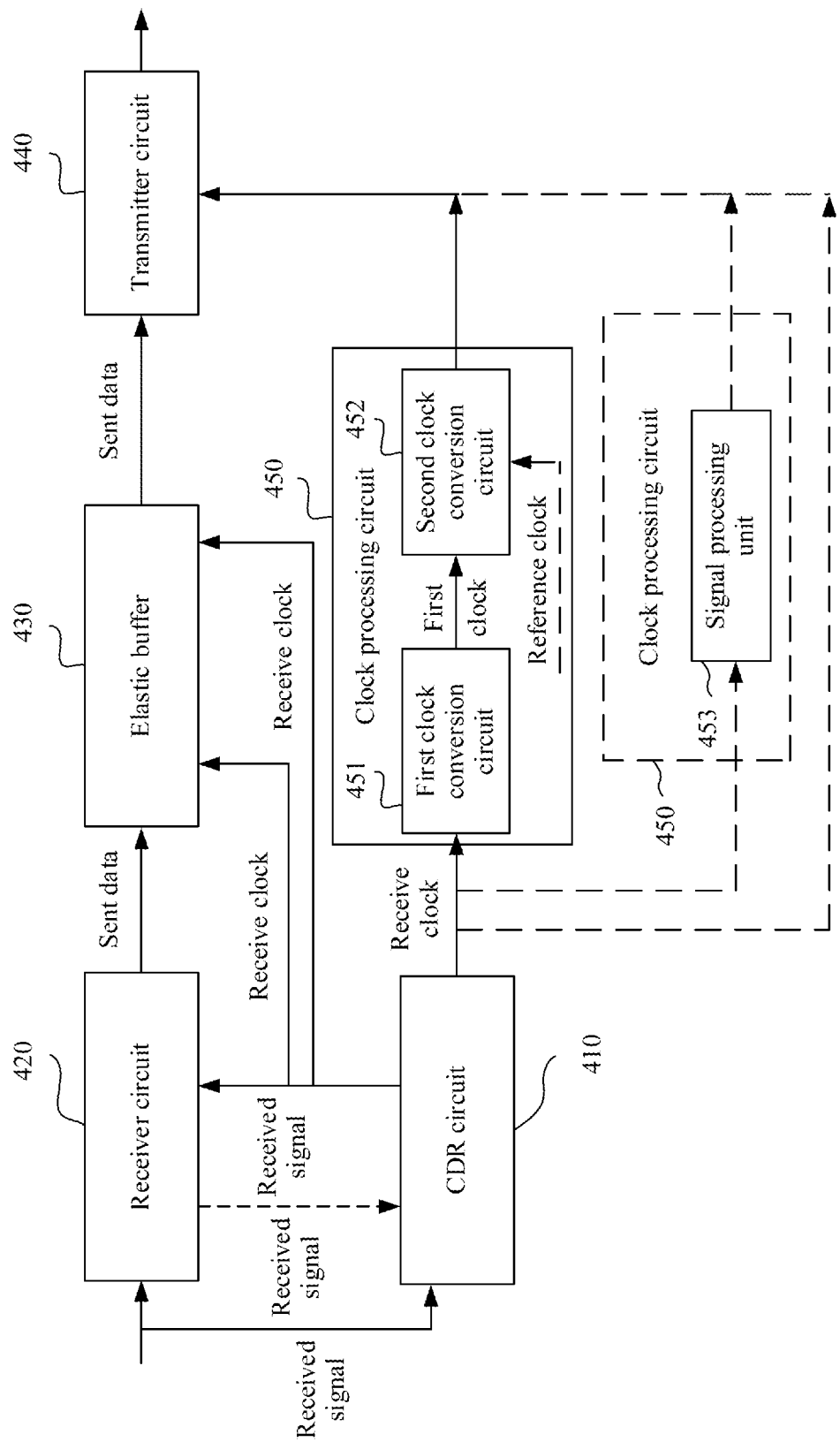
FIG. 4 is an example block diagram of a drive according to this application.

FIG. 4 is an example block diagram of a drive according to this application. The drive may be either of the drives shown in FIG. 1 and FIG. 2.

Referring to FIG. 4, the drive includes a CDR circuit 410, a receiver circuit 420, an elastic buffer 430, and a transmitter circuit 440.

The CDR circuit 410 is configured to recover a receive clock from a received signal. A person skilled in the art may understand that the received signal may be a signal sent by a transmit end or a signal obtained after particular processing is performed on a signal sent by a transmit end. The processing may be, for example, equalization processing. For example, that the drive is the drive $103_1$ shown in FIG. 2 is used as an example. The transmit end may be the primary chip 101 or the drive $103_2$. In other words, the received signal may be sent by the primary chip 101 or the drive $103_2$.

The receiver circuit 420 is configured to recover sent data from the received signal by using the receive clock. In other words, the receiver circuit 420 is configured to recover, from the received signal by using the receive clock, the data sent by the transmit end.

Specifically, the receiver circuit 420 samples, by using the receive clock, the received signal to obtain serial data, and may obtain parallel data based on the serial data, where the parallel data is the recovered sent data. The parallel data may be, for example, an output of a descrambling/decoding circuit 424 shown in FIG. 5, or may be an output of a serial-to-parallel conversion circuit 423.

The elastic buffer 430 is configured to: move the sent data in by using the receive clock, and move the sent data out by using the receive clock.

A person skilled in the art may understand that, that the elastic buffer 430 is configured to: move the sent data in by using the receive clock, and move the sent data out by using the receive clock specifically means that a clock used by the elastic buffer 430 to move the sent data in and a clock used by the elastic buffer 430 to move the sent data out, namely, a read clock and a write clock of the elastic buffer 430, are obtained based on the receive clock. Specifically, the read clock and the write clock of the elastic buffer 430 are equal to the receive clock divided by a quantity of bits included in one symbol output by the receiver circuit 420.

The transmitter circuit 440 is configured to send, by using the receive clock, the sent data moved out from the elastic buffer 430. It should be understood that, that the transmitter circuit 440 uses the receive clock means that the transmitter circuit 440 directly uses the receive clock or uses a clock obtained based on the receive clock.

For specific functions and implementations of the CDR circuit 410, the receiver circuit 420, and the transmitter circuit 440, refer to an existing drive. In the prior art, a receiver circuit and a transmitter circuit of the existing drive use two different clock domains, and a link state machine needs to irregularly add or delete an SKP sequence to or from an elastic buffer 330 to compensate for a frequency deviation between the two clock domains and prevent overflow of the elastic buffer. Different from the prior art, the receiver circuit and the transmitter circuit in this application use a same clock domain, namely, the receive clock recovered by the CDR so that a frequency difference between clocks of a receive end and a transmit end can be completely canceled, and a link state machine does not need to add or delete an SKP sequence to or from the elastic buffer 430, thereby canceling an extra latency caused by a frequency difference between receiving and transmission in an SRIS scenario.

To sum up, in the drive provided in this application, data is moved in to the elastic buffer and data is moved out from the elastic buffer by using the clock recovered by the CDR circuit, and data is sent by using the clock recovered by the CDR circuit so that a frequency difference between clocks of a receive end and a transmit end can be canceled, and there is no need to add or delete an SKP sequence to or from the elastic buffer, thereby canceling a problem of an extra latency caused because the SKP sequence is added or deleted, and implementing low-latency transmission.

Figure 5:
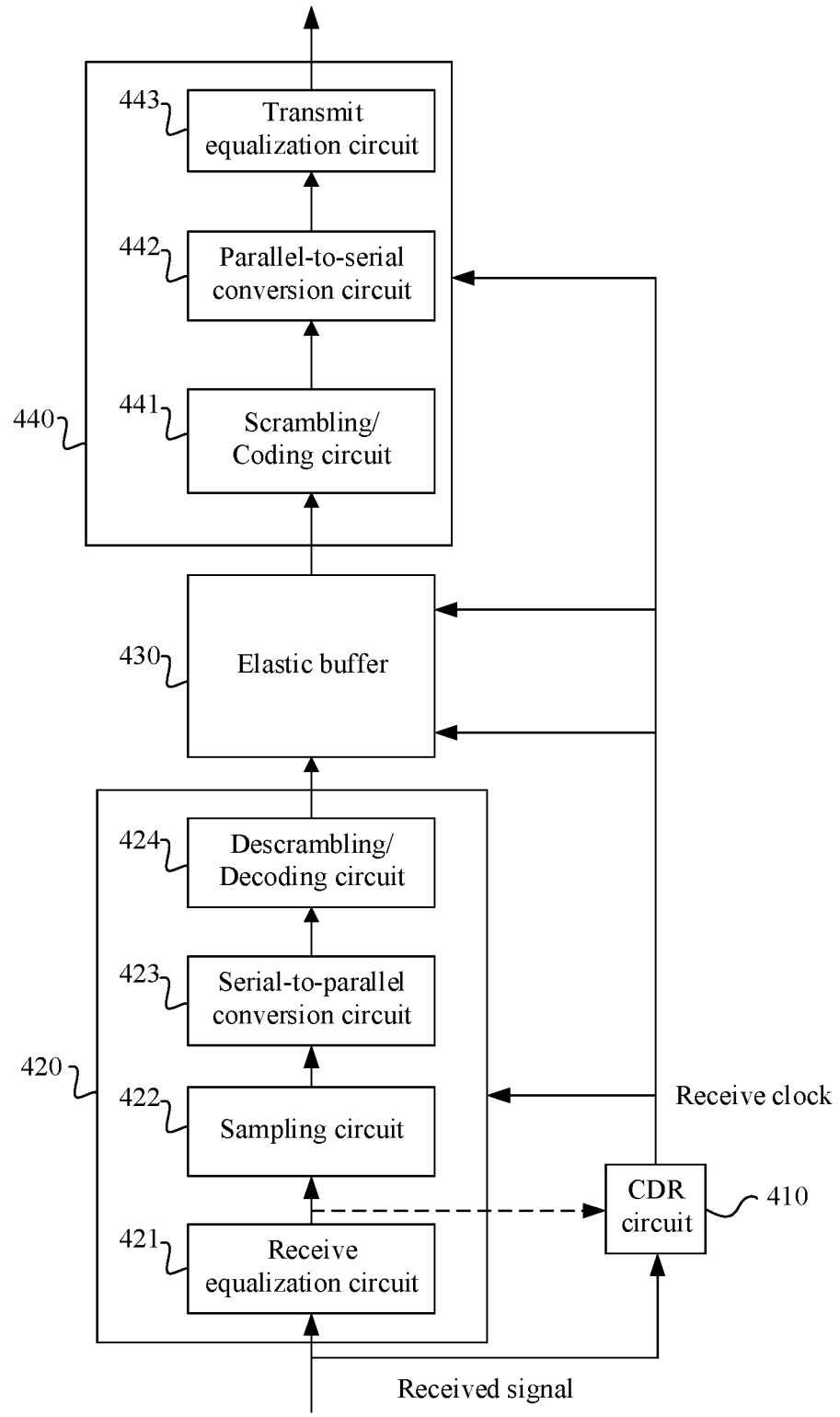
FIG. 5 is an example structural diagram of a drive according to this application.

FIG. 5 is an example structural diagram of a drive according to this application. The following describes modules shown in FIG. 5.

Referring to FIG. 5, a receiver circuit 420 may include a receive equalization circuit 421, a sampling circuit 422, a serial-to-parallel conversion circuit 423, and a descrambling/decoding circuit 424. A transmitter circuit 440 may include a scrambling/coding circuit 441, a parallel-to-serial conversion circuit 442, and a transmit equalization circuit 443. In addition, the drive shown in FIG. 5 may further include a CDR circuit 410 and an elastic buffer 430.

For example, the receive equalization circuit 421 may include a continuous time linear equalization (CTLE)/decision feedback equalizer (DFE) circuit. For a specific function and an implementation of the receive equalization circuit 421, refer to the prior art, and details are not described herein.

The sampling circuit 422 is configured to sample an output of the receive equalization circuit 421 by using a receive clock, to obtain serial data. It should be understood that the sampling circuit 422 may be implemented by using any circuit (including a chip, a physical circuit, an algorithm, and the like) having a sampling function. For details, refer to the prior art, and details are not described herein.

It should be noted that an input of the receive equalization circuit 421 may be a received signal, or an output of the receive equalization circuit 421 may be a received signal, in other words, an input of the sampling circuit 422 may be the received signal. To be specific, a signal sent by a transmit end and received by the drive may be directly input to the CDR circuit 410, or may be input to the CDR circuit 410 after passing through the receive equalization circuit 421.

The serial-to-parallel conversion circuit 423 may perform serial-to-parallel conversion on the serial data output by the sampling circuit 422, to obtain parallel data. The parallel data may be input to the descrambling/decoding circuit 424, and the descrambling/decoding circuit 424 performs parallel descrambling/decoding on the parallel data, to obtain descrambled/decoded parallel data. The descrambled/decoded parallel data may be input to the elastic buffer 430. The serial-to-parallel conversion circuit may be any circuit capable of converting serial data into parallel data, for example, a deserializer. For details, refer to the prior art, and details are not described herein. The descrambling/decoding circuit may be any circuit capable of implementing descrambling/decoding. For details, refer to the prior art, and details are not described herein.

The scrambling/coding circuit 441 may scramble/code an output of the elastic buffer 430, to output data conforming to a protocol or a coding structure.

The parallel-to-serial conversion circuit 442 may convert parallel data output by the scrambling/coding circuit 441 into serial data by using the receive clock. The parallel-to-serial conversion circuit 442 may be implemented by using any circuit capable of converting parallel data into serial data, for example, a serializer. For details, refer to the prior art, and details are not described herein.

The transmit equalization circuit 443 may include a feed forward equalizer (FFE) circuit. For a specific function and an implementation of the transmit equalization circuit 443, refer to the prior art, and details are not described herein.

It should be understood that each of the modules shown in FIG. 5 may be implemented by using one component or independent circuit, or a plurality of modules may be implemented by using one component or independent circuit, provided that the functions can be implemented. It should be further understood that a connection relationship between the modules shown in FIG. 5 is merely example description, and the connection relationship between the modules may be in another form provided that a basic function of the drive can be implemented. For example, the descrambling/decoding circuit 424 may be alternatively included in the transmitter circuit 440, in other words, the descrambling/decoding circuit 424 may be included in one of the receiver circuit 420 and the transmitter circuit 440. In addition, during specific implementation, a module not listed in the figure may be added according to an actual need, or some modules in the figure may be omitted according to an actual need.

In this application, the receive clock may be directly input to the transmitter circuit 440. In addition, the receive clock may be alternatively processed before being input to the transmitter circuit 440.

For example, the receive clock may be processed by using a clock conversion circuit 450 before being input to the transmitter circuit 440.

Specifically, the drive provided in this application may further include a clock processing circuit 450, configured to generate a transmit clock based on the receive clock. A frequency of the transmit clock is the same as a frequency of the receive clock.

In a possible implementation, the clock processing circuit 450 includes a first clock conversion circuit 451 and a second clock conversion circuit 452.

The first clock conversion circuit 451 is configured to generate a first clock based on the receive clock, where a frequency of the first clock is the same as an expected frequency of a local clock. The expected frequency of the local clock may be 100 MHz, in other words, the frequency of the first clock may be 100 MHz. However, this is not limited in this embodiment of this application.

The second clock conversion circuit 452 is configured to: generate the transmit clock based on the first clock, and output the transmit clock to the transmitter circuit 440.

The second clock conversion circuit 452 may be implemented by using a PLL circuit, for example, may be implemented by using a PLL circuit 360 shown in FIG. 3. For details, refer to the prior art, and details are not described herein.

For example, the first clock conversion circuit 451 may be implemented by using a charge pump phase-locked loop (CPPLL) frequency synthesizer.

Figure 6:
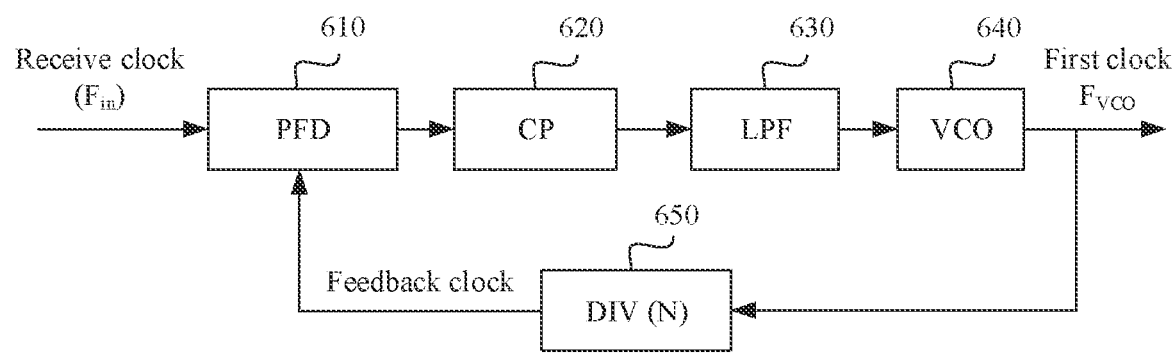
FIG. 6 is a circuit structural diagram of a CPPLL frequency synthesizer.

FIG. 6 is a circuit structural diagram of a CPPLL frequency synthesizer. Referring to FIG. 6, the CPPLL frequency synthesizer includes a phase frequency detector (PFD) 610, a charge pump (CP) 620, a loop filter (LPF) 630, a voltage-controlled oscillator (VCO) 640, and a frequency divider (FD) 650.

The PFD 610 compares frequencies and phases of an input clock $F_{in}$ and a feedback clock to generate a switch control signal of charging and discharging currents of the lower-level CP 620. Under the action of the control signal, the CP 620 charges or discharges the LPF 630 so that a tuned voltage of the VCO 640 changes correspondingly to change a resonance frequency of the VCO 640. The VCO 640 oscillates and outputs a signal $F_{VCO}$, the DIV 650 performs frequency division on the signal, and then the signal participates in frequency discrimination and phase discrimination. Therefore, a closed-loop feedback system is formed to implement a phase-locked frequency multiplication function.

A frequency of $F_{VCO}$ is N times a frequency of $F_{in}$, $F_{in}$ is the receive clock in this application. $F_{VCO}$ is the first clock in this application. N is a frequency multiplication coefficient, and may be preset during system design.

For details of the circuit shown in FIG. 6, refer to the prior art, and details are not described herein. It should be understood that the first clock conversion circuit 451 may be implemented in another manner, and this is not limited in this application.

Further, the second clock conversion circuit 452 may be further configured to: generate a second clock based on the local clock and output the second clock to the transmitter circuit 440, and the transmitter circuit 440 is further configured to send data by using the second clock.

Specifically, in some cases, a clock input to the second clock conversion circuit 452 may be the local clock, the second clock conversion circuit 452 may generate the second clock based on the local clock, and the transmitter circuit 440 may send data based on the second clock. In some other cases, a clock input to the second clock conversion circuit 452 is the first clock generated by the first clock conversion circuit 451, the second clock conversion circuit 452 may generate the transmit clock based on the first clock, and the transmitter circuit 440 may send data based on the transmit clock.

For example, the drive may work in a low-latency mode or a non-low-latency mode. In the low-latency mode, the first clock is selected as the input clock of the second clock conversion circuit, and in the non-low-latency mode, the local clock is selected as the input clock of the second clock conversion circuit. The low-latency mode may be used in a scenario having a relatively high requirement on a latency, but this is not limited in this application.

In another possible implementation, the clock processing circuit 450 includes a signal processing unit 453, and the signal processing unit 453 is configured to perform jitter filtering on the receive clock to generate a transmit clock and output the transmit clock to the transmitter circuit 440. A frequency of the transmit clock is the same as a frequency of the receive clock.

A specific form of the signal processing unit 453 may be a PLL circuit, for example, the PLL circuit 360 in FIG. 3. For the PLL circuit, refer to the prior art, and details are not described herein. It should be understood that a specific form of the signal processing unit 453 may be alternatively another circuit module capable of implementing jitter filtering. The specific form of the signal processing unit 453 is not limited in this application provided that the jitter filtering function can be implemented.

Jitter filtering is performed on the receive clock so that clock signal quality can be improved, helping to improve performance of the drive.

Optionally, in an embodiment of this application, the drive may support a plurality of protocols, for example, may support a high speed bus protocol such as PCIe. CCIX, or USB, and can select one protocol for working.

The drive in this application can support a plurality of high speed buses and is applied widely. In addition, during system design, there is no need to consider use of a plurality of drives. Therefore, hardware design complexity and a subsequent verification work amount can be reduced.

In a possible implementation, protocol selection of the drive may be implemented by using the following manner:
a. During system design, when a protocol scenario is determined for the drive, a pin specified by the drive may be pulled up or pulled down to select one protocol. For example, Table 1 shows a correspondence between a pin and a protocol.

TABLE 1

| PIN_A (pull-up 1/ pull-down 0) | PIN_B (pull-up 1/ pull-down 0) | Supported protocol |
|---|---|---|
| 0 | 0 | PCIe |
| 0 | 1 | CCIX |
| 1 | 0 | USB |
| ... | ... | ... |

In Table 1, PIN_A and PIN_B are two pins of the drive, and protocol selection of the drive can be implemented through a pull-up/pull-down operation on the two pins. For example, when the pin PIN_A is pulled up, and the pin PIN_B is pulled down, the drive can support the USB protocol.

b. The drive is configured by system software after power-on and by using a management interface (for example, an Smbus) defined in a standard, to work under a particular protocol.

c. A protocol used by the drive is configured by using a particular negotiation bitstream (for example, marked as a first negotiation bitstream). In other words, one negotiation bitstream may correspond to one protocol, and a corresponding protocol may be configured by using a corresponding negotiation bitstream.

Figure 7:
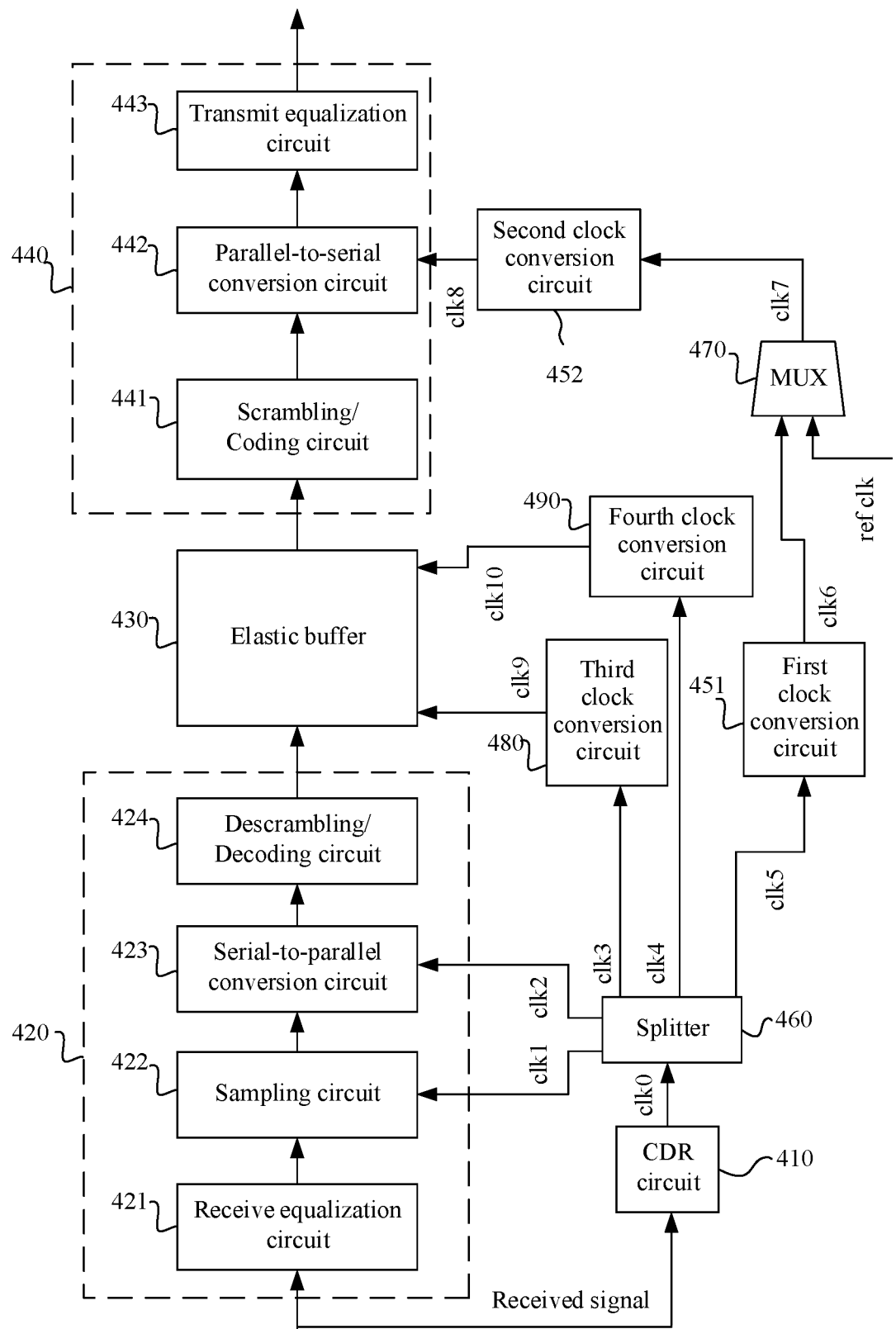
FIG. 7 is an example structural diagram of a drive according to this application.
Figure 8:
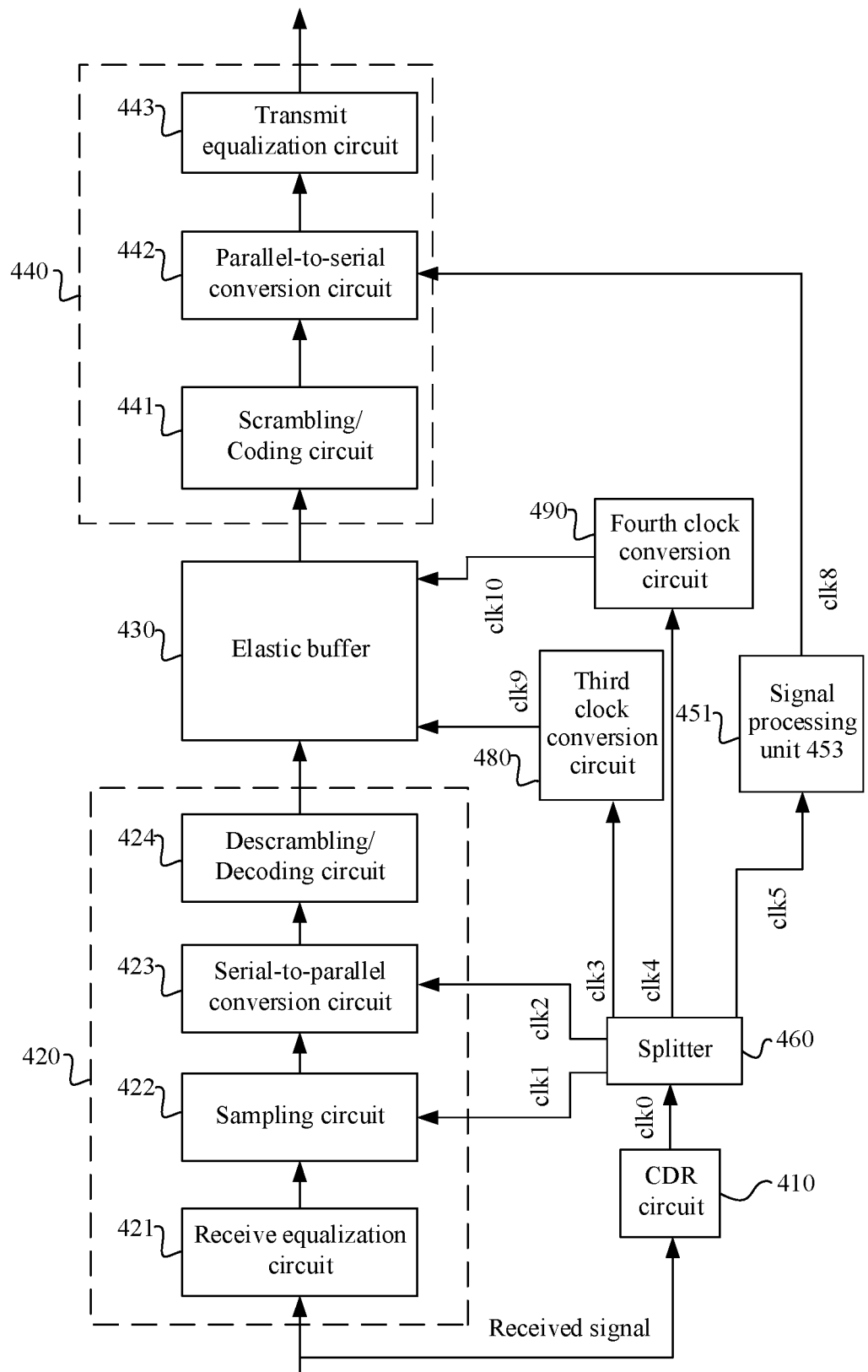
FIG. 8 is another example structural diagram of a drive according to this application.

To help a person skilled in the art to better understand this application, the following provides two specific structural diagrams of drives with reference to FIG. 7 and FIG. 8. It should be understood that the two structural diagrams are merely examples of structural diagrams, and should not constitute any limitation to this application.

FIG. 7 is an example structural diagram of a drive according to this application. Referring to the drive shown in FIG. 7, the drive includes a CDR circuit 410, a receiver circuit 420, an elastic buffer 430, a transmitter circuit 440, a first clock conversion circuit 451, a second clock conversion circuit 452, a splitter 460, a multiplexer (MUX) 470, a third clock conversion circuit 480, and a fourth clock conversion circuit 490. The receiver circuit 420 includes a receive equalization circuit 421, a sampling circuit 422, a serial-to-parallel conversion circuit 423, and a descrambling/decoding circuit 424. The transmitter circuit 440 includes a scrambling/coding circuit 441, a parallel-to-serial conversion circuit 442, and a transmit equalization circuit 443.

The splitter 460 is configured to split, into clk1, clk2, clk3, clk4, and clk5, a receive clock clk0 recovered by the CDR circuit 410 from a received signal.

The clk1 and the clk2 are respectively output to the sampling circuit 422 and the serial-to-parallel conversion circuit 423, the clk1 is used by the sampling circuit 422 to perform sampling, and the clk2 is used by the serial-to-parallel conversion circuit 423 to convert serial data into parallel data (namely, a symbol). The clk3 and the clk4 are respectively output to the third clock conversion circuit 480 and the fourth clock conversion circuit 490. The third clock conversion circuit 480 is configured to obtain clk9 based on the clk3, and the fourth clock conversion circuit 490 is configured to obtain clk10 based on the clk4. The third clock conversion circuit 480 and the fourth clock conversion circuit 490 may be frequency dividers. However, this is not limited in this embodiment of this application. $f_{clk9}=f_{clk3}/M$, $f_{clk10}=f_{clk4}/M$, $f_{clk9}=f_{clk10}$, and M is a quantity of bits included in a symbol output by the serial-to-parallel conversion circuit 423, for example, M=10 or 8. However, this is not limited in this embodiment of this application. $f_{clki}$ represents a frequency of clki (i=0, 1, 2, . . . ). It should be understood that the clk0 may be referred to as a bit clock, and the clk9 and the clk10 may be referred to as symbol clocks. The clk9 and the clk10 are respectively used as a read clock and a write clock of the elastic buffer 430 and are respectively used by the elastic buffer 430 to move data in and move data out.

An input of the first clock conversion circuit 451 is the clk5, and the first clock conversion circuit 451 may generate a first clock, namely, the clk6, based on the clk5. The MUX 470 selects one of the clk6 and a local clock (namely, ref clk) as an output, for example, selects the clk6 as the output in a low-latency mode and selects the ref clk as the output in a non-low-latency mode.

An output clk7 of the MUX 630 is input to the second clock conversion circuit 452, and the second clock conversion circuit 452 generates, based on the clk7, a clock, namely, clk8, used by the transmitter circuit 440. When the MUX 630 selects the clk6 as the output, the clk7 is the clk6, and the clk8 is a transmit clock. In this case, a frequency of the clk8 is the same as a frequency of the clk0. When the MUX 630 selects the ref clk as the output, the clk7 is the ref clk, and the clk8 is a second clock.

It should be understood that an implementation of the splitter 460 is not limited in this application provided that the receive clock can be divided into a plurality of clocks for output.

The drive provided in this embodiment of this application can resolve a problem of an extra latency caused because an SKP sequence is added to or deleted from the elastic buffer, and implement low-latency transmission. In addition, the drive has a function of selecting an internal clock and an external clock, that is, can select one of the receive clock and the local clock as the input clock of the second clock conversion circuit. This can adapt to a plurality of scenario requirements.

FIG. 8 is another example structural diagram of a drive according to this application. Referring to the drive shown in FIG. 8, the drive includes a CDR circuit 410, a receiver circuit 420, an elastic buffer 430, a transmitter circuit 440, a splitter 460, a signal processing unit 453, a third clock conversion circuit 480, and a fourth clock conversion circuit 490. The receiver circuit 420 includes a receive equalization circuit 421, a sampling circuit 422, a serial-to-parallel conversion circuit 423, and a descrambling/decoding circuit 424. The transmitter circuit 440 includes a scrambling/coding circuit 441, a parallel-to-serial conversion circuit 442, and a transmit equalization circuit 443.

For functions of the modules shown in FIG. 8, refer to the foregoing descriptions of the drive shown in FIG. 7. In FIG. 8, the signal processing unit 453 is configured to perform jitter filtering on clk5 to generate a transmit clock (namely, clk8). The transmitter circuit 440 may send data based on the clk8. A frequency of the clk8 is the same as a frequency of clk0.

The drive provided in this embodiment of this application performs filtering processing on a clock (the clk5) output by the CDR to improve clock signal quality. Because there is no deviation between the transmit clock and the receive clock, the drive can resolve a problem of an extra latency caused because an SKP sequence is added to or deleted from the elastic buffer and implement low-latency transmission.

Figure 9:
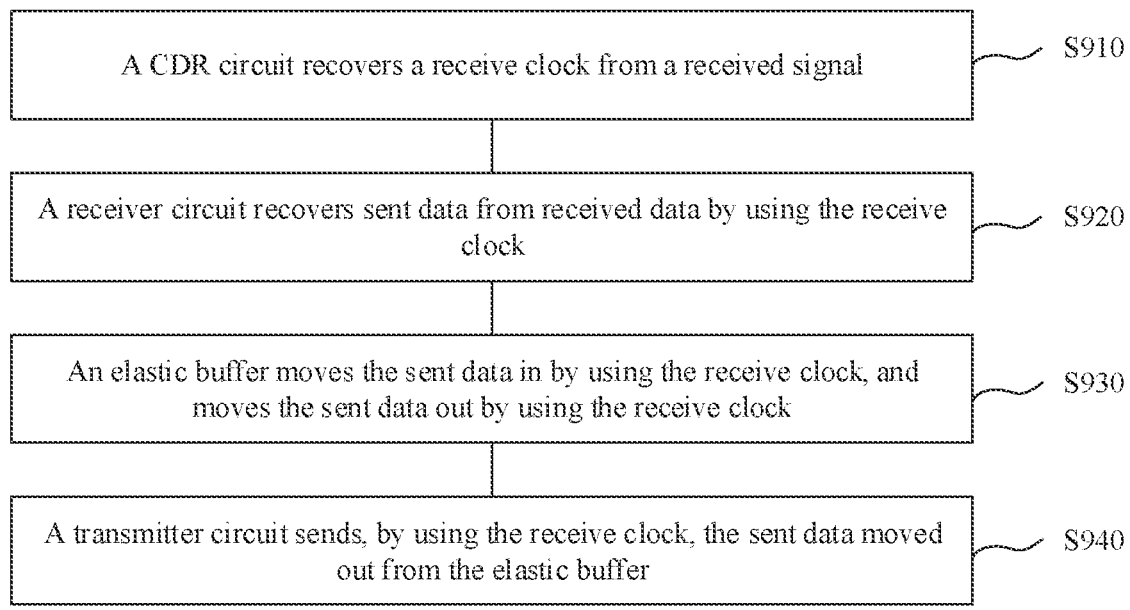
FIG. 9 is a schematic flowchart of a data transmission method according to this application.

FIG. 9 is a schematic flowchart of a data transmission method according to this application. The method is applied to a drive, and the drive includes: a clock and data recovery CDR circuit, an elastic buffer, a receiver circuit, and a transmitter circuit.

The method includes:

S910: The CDR circuit recovers a receive clock from a received signal.

S920: The receiver circuit recovers sent data from the received signal by using the receive clock.

S930: The elastic buffer moves the sent data in by using the receive clock, and moves the sent data out by using the receive clock.

S940: The transmitter circuit sends, by using the receive clock, the sent data moved out from the elastic buffer.

In the data transmission method in this application, because the receiver circuit and the transmitter circuit use a same clock domain, namely, the receive clock recovered by the CDR, a frequency difference between clocks of a receive end and a transmit end can be completely canceled, and a link state machine does not need to add or delete an SKP sequence to or from the elastic buffer, thereby canceling an extra latency caused by a frequency difference between receiving and transmission in an SRIS scenario and implementing low-latency transmission.

It should be understood that the method shown in FIG. 9 may be performed when the drive enables a low-latency mode and is connected to a downstream chip. However, this is not limited in this application. In addition, after the method shown in FIG. 9 is performed, the drive may perform link training with an upstream chip and the downstream chip.

Optionally, in an embodiment of this application, the drive further includes a first clock conversion circuit and a second clock conversion circuit. The first clock conversion circuit generates a first clock based on the receive clock, where a frequency of the first clock is the same as an expected frequency of a local clock. The second clock conversion circuit generates a transmit clock based on the first clock and outputs the transmit clock to the transmitter circuit, where a frequency of the transmit clock is the same as a frequency of the receive clock.

Optionally, in an embodiment of this application, in the low-latency mode, the first clock is input to the second clock conversion circuit, and in a non-low-latency mode, the local clock is input to the second clock conversion circuit.

Optionally, in an embodiment of this application, a frequency of the first clock is 100 MHz.

Optionally, in an embodiment of this application, the drive further includes a signal processing unit, and the signal processing unit performs jitter filtering on the receive clock to generate a transmit clock, and output the transmit clock to the transmitter circuit, where a frequency of the transmit clock is the same as a frequency of the receive clock.

Optionally, in an embodiment of this application, the drive supports a plurality of protocols and can select one of the plurality of protocols for working, and the plurality of protocols include at least one of the following: a PCIe protocol, a CCIX protocol, or a USB protocol.

For specific details of the method shown in FIG. 9 and a specific implementation of the drive, refer to the descriptions of the drives shown in FIG. 4 to FIG. 8, and details are not described herein again.

It should be noted that the drive provided in this application may support a plurality of lanes. In a possible implementation, the CDR circuit of the drive may be used in one or more lanes, and the other modules than the CDR circuit may correspond to one direction in one lane. In a possible implementation, the CDR circuit and the clock processing circuit of the drive may be used in one or more lanes, and the other modules may correspond to one direction in one lane. In a possible implementation, the CDR circuit and the second clock conversion circuit of the drive may correspond to one lane, or may correspond to a plurality of lanes.

Figure 10:
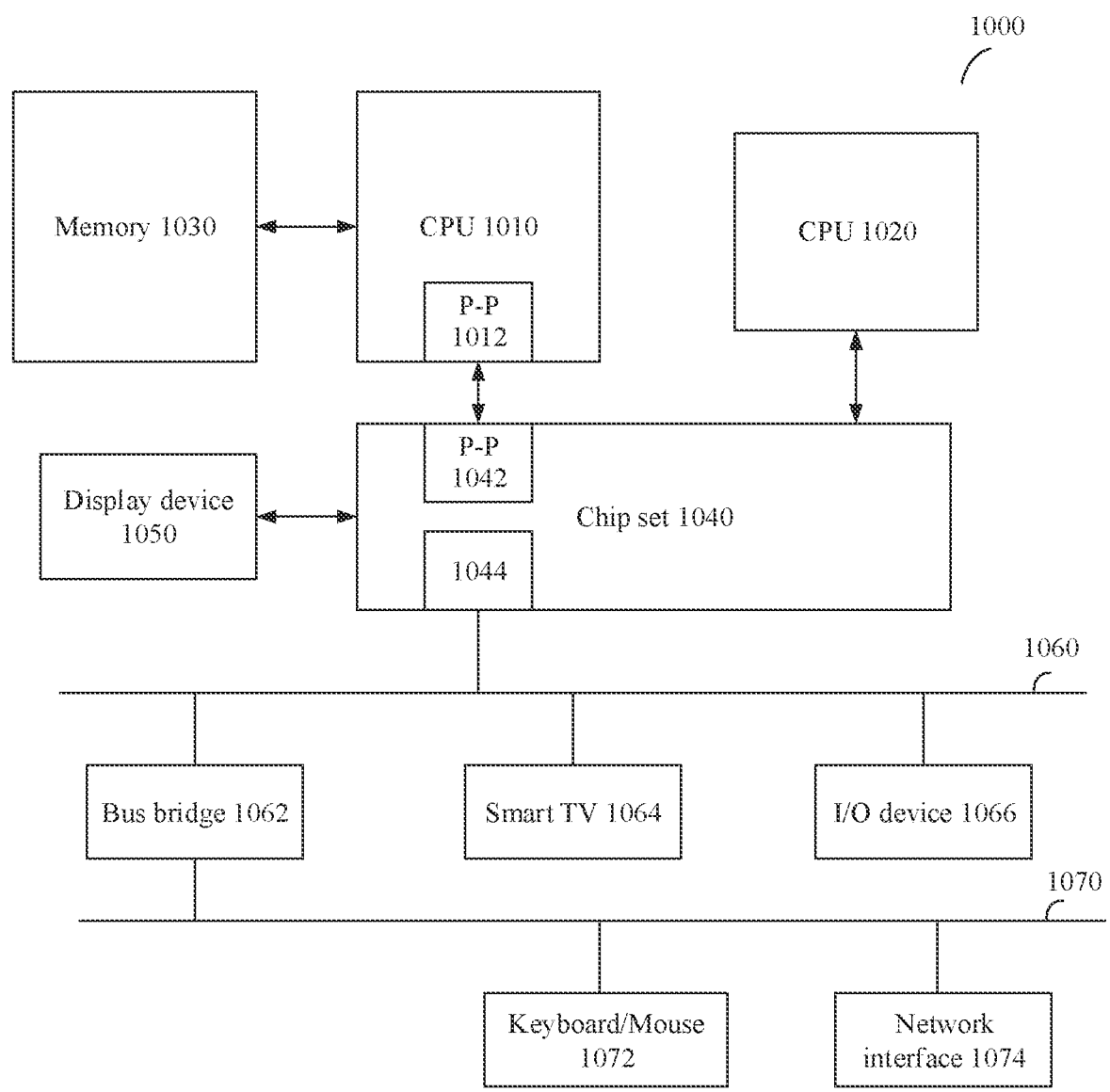
FIG. 10 is a schematic diagram of a system according to this application.

FIG. 10 is a schematic diagram of a system 900 capable of using the technology provided in this application. For example, the technology may be integrated into an interconnect or an interface in the system 1000.

Referring to FIG. 10, the system 1000 includes, but not limited to, a desktop computer, a notebook computer, a network book, a tablet computer, a notebook computer, a personal digital assistant (PDA), a server, a workstation, a mobile phone, a mobile computing device, a smartphone, an internet device, or any computing device of another type.

In a possible implementation, the system 1000 may include a processor, for example, a processor 1010. In another possible implementation, the system 1000 may include a plurality of processors, for example, processors 1010 and 1020. The processor 1020 has logic similar to or the same as logic of the processor 1010, or the processor 1020 has logic completely independent of logic of the processor 1010. The processor may be a central processing unit (CPU), or the processor may be another general purpose processor, a digital signal processor (DSP), an application-specific integrated circuit (ASIC), a field programmable gate array (FPGA) or another programmable logical device, a discrete gate or transistor logic device, a discrete hardware component, or the like. The general purpose processor may be a microprocessor, or the processor may be any conventional processor or the like.

In a possible implementation, the system 1000 may include a memory 1030. The processor 1010 can access the memory 1030 and has a function of communicating with the memory 1030. The memory 1030 stores information and an instruction that are to be executed by the processor 1010. The memory 1030 includes a volatile memory and/or a nonvolatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), used as an external cache. Through example but not limitative description, random access memories (RAM) in many forms are available, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchronous link dynamic random access memory (SLDRAM), and a direct rambus dynamic random access memory (DR RAM).

In a possible implementation, the processors 1010 and 1020 may communicate with a chip set 1040. In a possible implementation, the chip set 1040 is connected to the processor 1010 by using point to point (P-P) interfaces 1042 and 1012. The interfaces 1042 and 1012 may communicate based on any possible P-P communication protocol.

In a possible implementation, the chip set 1040 may communicate with a display device 1050 and another device by using an interface 1044. The another device is, for example, a bus bridge 1062, a smart TV 1064, an I/O device 1066, a keyboard/mouse 1072, and a network interface 1074 that are shown in the figure. The display device 1050 includes, but not limited to, a liquid crystal display (LCD), plasma, and a cathode-ray tube (CRT).

In a possible implementation, the chip set 1040 may be connected to and communicate with the another device by using one or more buses 1060 and 1070. In a possible implementation, the buses 1060 and 1070 may be interconnected by using the bus bridge 1062.

In a possible implementation, the network interface 1074 is implemented by using a common network interface standard of any type, and includes, but is not limited to, an Ethernet interface, a USB interface, a PCIe interface, a CCIX interface, a radio interface, and/or any other interface of an appropriate type.

It should be understood that although some modules in FIG. 10 are described as independent modules in the system 1000, functions executed by some of the modules may be integrated into a single semiconductor circuit, or may be implemented by using two or more independent integrated circuits.

This application further provides a computer-readable storage medium, configured to store a computer program. The computer program includes an instruction used to perform the method in the foregoing method embodiment.

This application further provides a computer program product including an instruction. When the computer program product is run on a computer, the computer is enabled to perform the method embodiment.

It should be understood that the term "and/or" in this specification describes only an association relationship for describing associated objects and represents that three relationships may exist. For example, A and/or B may represent the following three cases. Only A exists, both A and B exist, and only B exists. In addition, the character "/" in this specification generally indicates an "or" relationship between the associated objects.

It should be further understood that "first" and "second" in the embodiments of this application are merely for distinguishing, and should not constitute any limitation to this application.

It should be further understood that sequence numbers of the foregoing processes do not mean execution sequences in various embodiments of this application. The execution sequences of the processes should be determined based on functions and internal logic of the processes and should not be construed as any limitation on the implementation processes of the embodiments of this application.

A person of ordinary skill in the art may be aware that units and algorithm steps in the examples described with reference to the embodiments disclosed in this specification may be implemented by electronic hardware or a combination of computer software and electronic hardware. Whether the functions are executed by hardware or software depends on particular applications and design constraint conditions of the technical solutions. A person skilled in the art may use different methods to implement the described functions for each particular application, but it should not be considered that the implementation goes beyond the scope of this application.

A person skilled in the art may clearly understand that for the purpose of convenient and brief description, for a detailed working process of the foregoing system, apparatus, and unit, refer to the corresponding processes in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not executed. In addition, the displayed or discussed mutual couplings or direct couplings or communication connections may be implemented by using some interfaces. The indirect couplings or communication connections between the apparatuses or units may be implemented in an electronic form, a mechanical form, or another form.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or at least two units are integrated into one unit.

When the functions are implemented in a form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium and includes one or more instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A drive, comprising:
a clock and data recovery (CDR) circuit, an elastic buffer, a receiver circuit, and a transmitter circuit, wherein:
the CDR circuit is configured to:
recover a receive clock from a received signal; and
output the receive clock to both the receiver circuit and the elastic buffer, wherein the receive clock is output to the elastic buffer as both a read clock and a write clock of the elastic buffer;
the receiver circuit is configured to recover sent data from the received signal by using the receive clock;
the elastic buffer is configured to move the sent data in by using the receive clock received from the CDR circuit and move the sent data out by using the same receive clock received from the CDR circuit; and
the transmitter circuit is configured to send the sent data from the elastic buffer by using the receive clock.

2. The drive according to claim 1, wherein the drive further comprises a first clock conversion circuit and a second clock conversion circuit, wherein:
the first clock conversion circuit is configured to generate a first clock based on the receive clock and output the first clock to the second clock conversion circuit, wherein a frequency of the first clock is the same as a frequency of a local clock; and
the second clock conversion circuit is configured to generate a transmit clock based on the first clock received from the first clock conversion circuit, and output the transmit clock to the transmitter circuit, wherein a frequency of the transmit clock is the same as a frequency of the receive clock.

3. The drive according to claim 2, wherein:
in a low-latency mode, an input clock of the second clock conversion circuit is the first clock; and
in a non-low-latency mode, an input clock of the second clock conversion circuit is the local clock.

4. The drive according to claim 1, wherein the drive further comprises a signal processing unit, and the signal processing unit is configured to:
perform jitter filtering on the receive clock to generate a transmit clock; and
output the transmit clock to the transmitter circuit, wherein a frequency of the transmit clock is the same as a frequency of the receive clock.

5. The drive according to claim 1, wherein the drive supports a plurality of protocols and is operable to select one of the plurality of protocols for working, and the plurality of protocols comprise at least one of the following:
a peripheral component interconnect express (PCIe) protocol, a cache coherent interconnect for accelerators (CCIX) protocol, or a universal serial bus (USB) protocol.

6. The drive according to claim 2, wherein the drive supports a plurality of protocols and is operable to select one of the plurality of protocols for working, and the plurality of protocols comprise at least one of the following:
a peripheral component interconnect express (PCIe) protocol, a cache coherent interconnect for accelerators (CCIX) protocol, or a universal serial bus (USB) protocol.

7. The drive according to claim 3, wherein the drive supports a plurality of protocols and is operable to select one of the plurality of protocols for working, and the plurality of protocols comprise at least one of the following:
a peripheral component interconnect express (PCIe) protocol, a cache coherent interconnect for accelerators (CCIX) protocol, or a universal serial bus (USB) protocol.

8. A data transmission method, comprising:
recovering, by a clock and data recovery (CDR) circuit of a drive, a receive clock from a received signal;
outputting, by the CDR circuit of the drive, the receive clock to both a receiver circuit of the drive and an elastic buffer of the drive, wherein the receive clock is output to the elastic buffer of the drive as both a read clock and a write clock of the elastic buffer of the drive;
recovering, by the receiver circuit of the drive, sent data from the received signal by using the receive clock;
moving, by the elastic buffer of the drive, the sent data in by using the receive clock received from the CDR circuit of the drive and moving the sent data out by using the receive clock received from the CDR circuit of the drive; and
sending, by a transmitter circuit of the drive, the sent data from the elastic buffer by using the receive clock.

9. The method according to claim 8, wherein the drive further comprises a first clock conversion circuit and a second clock conversion circuit, wherein the method further comprises:
generating, by the first clock conversion circuit, a first clock based on the receive clock and outputting the first clock to the second clock conversion circuit, wherein a frequency of the first clock is the same as a frequency of a local clock; and
generating, by the second clock conversion circuit, a transmit clock based on the first clock received from the first clock conversion circuit, and outputting the transmit clock to the transmitter circuit, wherein a frequency of the transmit clock is the same as a frequency of the receive clock.

10. The method according to claim 9, wherein:
in a low-latency mode, the first clock is input to the second clock conversion circuit; and
in a non-low-latency mode, the local clock is input to the second clock conversion circuit.

11. The method according to claim 9, wherein the frequency of the first clock is 100 MHz.

12. The method according to claim 10, wherein the frequency of the first clock is 100 MHz.

13. The method according to claim 8, wherein the drive further comprises a signal processing unit, wherein the method further comprises:
   performing, by the signal processing unit, jitter filtering on the receive clock to generate a transmit clock; and
   outputting by the signal processing unit, the transmit clock to the transmitter circuit, wherein a frequency of the transmit clock is the same as a frequency of the receive clock.

14. The method according to claim 8, wherein the drive supports a plurality of protocols and is operable to select one of the plurality of protocols for working, and the plurality of protocols comprise at least one of the following:
   a peripheral component interconnect express (PCIe) protocol, a cache coherent interconnect for accelerators (CCIX) protocol, or a universal serial bus (USB) protocol.

15. The method according to claim 9, wherein the drive supports a plurality of protocols and is operable to select one of the plurality of protocols for working, and the plurality of protocols comprise at least one of the following:
   a peripheral component interconnect express (PCIe) protocol, a cache coherent interconnect for accelerators (CCIX) protocol, or a universal serial bus (USB) protocol.

16. The method according to claim 10, wherein the drive supports a plurality of protocols and is operable to select one of the plurality of protocols for working, and the plurality of protocols comprise at least one of the following:
   a peripheral component interconnect express (PCIe) protocol, a cache coherent interconnect for accelerators (CCIX) protocol, or a universal serial bus (USB) protocol.

17. The method according to claim 11, wherein the drive supports a plurality of protocols and is operable to select one of the plurality of protocols for working, and the plurality of protocols comprise at least one of the following:
   a peripheral component interconnect express (PCIe) protocol, a cache coherent interconnect for accelerators (CCIX) protocol, or a universal serial bus (USB) protocol.

18. A non-transitory computer storage medium, comprising a computer program that, when executed by a computer, causes the computer to initiate operations comprising:
   recovering, by a clock and data recovery (CDR) circuit of a drive, a receive clock from a received signal;
   outputting, by the CDR circuit of the drive, the receive clock to both a receiver circuit of the drive and an elastic buffer of the drive, wherein the receive clock is output to the elastic buffer of the drive as both a read clock and a write clock of the elastic buffer of the drive;
   recovering, by the receiver circuit of the drive, sent data from the received signal by using the receive clock;
   moving, by the elastic buffer of the drive, the sent data in by using the receive clock received from the CDR circuit of the drive and moving the sent data out by using the receive clock received from the CDR circuit of the drive; and
   sending, by a transmitter circuit of the drive, the sent data from the elastic buffer by using the receive clock.

19. The drive according to claim 1, wherein a frequency of the read clock and a frequency of the write clock are equal to a frequency of the receive clock divided by a quantity of bits included in one symbol output by the receiver circuit.

20. A device, comprising a driver chip, wherein the driver chip comprises:
   a clock and data recovery (CDR) circuit, an elastic buffer, a receiver circuit, and a transmitter circuit, wherein:
   the CDR circuit is configured to:
      recover a receive clock from a received signal; and
      output the receive clock to both the receiver circuit and the elastic buffer, wherein the receive clock is output to the elastic buffer as both a read clock and a write clock of the elastic buffer;
   the receiver circuit is configured to recover sent data from the received signal by using the receive clock;
   the elastic buffer is configured to move the sent data in by using the receive clock received from the CDR circuit and move the sent data out by using the same receive clock received from the CDR circuit; and
   the transmitter circuit is configured to send the sent data from the elastic buffer by using the receive clock.

21. The drive according to claim 1, further comprising a splitter, wherein the splitter is configured to split the receive clock recovered by the CDR circuit into the read clock and the write clock of the elastic buffer.

* * * * *